United States Patent
Ripley et al.

(10) Patent No.: US 8,330,546 B2
(45) Date of Patent: *Dec. 11, 2012

(54) SYSTEMS AND METHODS FOR SATURATION CORRECTION IN A POWER CONTROL LOOP

(75) Inventors: David S. Ripley, Marion, IA (US); Kerry B. Phillips, Haverhill, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/470,019

(22) Filed: May 11, 2012

(65) Prior Publication Data

US 2012/0218039 A1 Aug. 30, 2012

Related U.S. Application Data

(63) Continuation of application No. 12/666,254, filed as application No. PCT/US2008/069166 on Jul. 3, 2008, now Pat. No. 8,188,793.

(60) Provisional application No. 60/958,598, filed on Jul. 5, 2007.

(51) Int. Cl.
*H03F 3/20* (2006.01)

(52) U.S. Cl. .......... 330/285; 330/140

(58) Field of Classification Search ........... 330/140, 330/285, 297

See application file for complete search history.

(56) References Cited

U.S. PATENT DOCUMENTS

| | | | |
|---|---|---|---|
| 5,589,796 A | 12/1996 | Alberth, Jr. et al. | |
| 6,020,787 A | 2/2000 | Kim et al. | |
| 6,430,402 B1 * | 8/2002 | Agahi-Kesheh | 455/115.3 |
| 6,476,677 B1 | 11/2002 | Komaili et al. | |
| 6,734,729 B1 * | 5/2004 | Andrys et al. | 330/129 |
| 6,922,100 B2 | 7/2005 | Midya et al. | |
| 7,706,760 B2 * | 4/2010 | Rozenblit et al. | 455/127.1 |
| 2003/0160658 A1 | 8/2003 | Cioffi et al. | |

FOREIGN PATENT DOCUMENTS

| | | |
|---|---|---|
| EP | 1528671 A1 | 5/2005 |
| WO | 9222133 A1 | 12/1992 |

OTHER PUBLICATIONS

Supplemental European Search Report from EP Application PCT/US2008/069166 dated Mar. 19, 2012.
International Search Report and Written Opinion in International Application No. PCT/US2008/069166, dated Jan. 28, 2009.

* cited by examiner

*Primary Examiner* — Steven J Mottola

(74) *Attorney, Agent, or Firm* — Lando & Anastasi, LLP

(57) ABSTRACT

A power amplification circuit includes a power amplifier, an RF detector, an error amplifier, a saturation detector, and an offset circuit. The power amplifier provides an amplified signal based on an input signal and a gain control signal. The RF detector provides a detection signal indicative of a logarithm of the power of the amplified signal. The error amplifier provides the gain control signal based on an amplification control signal and the detection signal. The saturation detector provides a saturation signal in response to the gain control signal differing from a reference signal by less than a first predetermined voltage. The offset circuit decreases a voltage level of the amplification control signal by up to a second predetermined voltage in response to the saturation signal and the amplification control signal differing from the detection signal by less than the second predetermined voltage.

20 Claims, 5 Drawing Sheets

SYSTEMS AND METHODS FOR SATURATION CORRECTION IN A POWER CONTROL LOOP

BACKGROUND OF THE INVENTION

1. Field of Invention

This disclosure relates to the field of power amplifier circuits, and more specifically to the detection and correction of saturation in power amplification circuits.

2. Discussion of Related Art

In some applications where power amplification of signals is required, precise control of the power gain may be desirable to achieve desired signal properties. For example, transmission modules used in communications devices such as cellular telephones, personal digital assistants (PDAs), etc. may require precise internal power control in certain modes of operation, such as Gaussian Minimum Shift Keying (GMSK) mode. In such applications, a power control circuit may be used that controls the gain of an amplifier stage. A typical control loop controls the amplifier gain via a loop error voltage based upon the difference between the output of a RF detector and a loop set point. The detector (which may be either a linear or a logarithmic detector) samples the amplified signal and produces a detector output indicative of the magnitude of the amplified signal (e.g., based upon the rf amplitude or the power of the amplified signal). The loop error voltage typically passes through an error amplifier (which may be proportional, integral, derivative, or a combination of any such elements, according to the requirements of the control loop design), yielding a gain control signal that controls the gain of the power amplifier.

Such power control feedback loops suffer severe degradation of performance as the amplifier approaches saturation. When the power amplifier saturates, increases in the gain control signal no longer result in increases in the power amplifier output. This leads to breakdown of the loop performance, such as, for example, the gain control voltage being pinned to the high rail as it increases in an attempt increase the output of the saturated power amplifier output. This condition is sometimes referred to as "loop saturation."

In some applications, loop performance can be exceptionally sensitive to saturation, resulting in a power amplifier output other than what is desired. For example, in a typical circuit, control loop performance can degrade beyond acceptable limits at as little as 0.1 dB power amplifier saturation. One way to avoid loop saturation is to monitor the loop error signal and reduce the loop setpoint when saturation (or the imminent onset of saturation) is detected. Saturation can be difficult to detect, however, where the error induced by the saturation is small. In a typical loop circuit using a logarithmic detector to measure the amplifier output, for example, the detector sensitivity may be 50 mV per dB. An error of 0.1 dB in power then results in only 5 mV of error in the loop feedback signal. Since 5 mV is on the order of the error in standard CMOS amplifier input offsets, it may not be possible for the system to cleanly distinguish loop saturation from normal production variation in the performance of the amplifier itself.

Loop saturation may be easier to detect using a linear detector, where the detector sensitivity near saturation may be considerably higher; saturation can be observed directly by monitoring the loop error signal for deviation from zero when saturation occurs. However, as discussed further below, in a circuit using linear detection, applying a constant reduction to the loop setpoint results in an unacceptable distortion of the loop output. Further, in some applications it may be preferable for other reasons to use logarithmic detection. For example, compared to linear detection, logarithmic detection can provide a much wider dynamic range, which is desirable in many applications.

Thus, in many applications, it is preferable to use a logarithmic detector in the control loop, making saturation more difficult to detect.

SUMMARY OF THE INVENTION

Systems described herein include power amplification circuits that include circuitry to monitor signals at certain points in a control loop to determine when saturation exists (or is imminent), and process those signals to cause a step in an indicator voltage upon the commencement (or upon the imminent commencement) of saturation. This step can be observed by a controller that may respond to loop saturation in an appropriate manner. In particular, systems described herein include power amplification circuits that include logarithmic detection, and detect saturation (or the imminent onset of saturation) by monitoring a gain control voltage. According to another aspect, systems described herein include analog circuitry that responds to and corrects the detected saturation. In particular, the systems described include control circuits that correct detected saturation by applying an offset to a setpoint signal.

According to one aspect of the present invention, a power amplification circuit is presented, the circuit comprising a power amplifier having a power input to receive an input signal, a gain control input to receive a gain control signal, and a power output to provide an amplified output signal based upon the input signal and the gain control signal; a power detector to provide a power detector signal indicative of a magnitude of the amplified output signal of the power amplifier; an error amplifier having a first input to receive an amplification control signal, a second input to receive a signal based upon the detector signal, and an output electrically coupled to the gain control input of the power amplifier; and a saturation detector having a first input to receive a signal based upon the gain control signal, a second input to receive a reference signal, and an output to provide a saturation detection signal indicating whether gain control signal exceeds the reference signal. According to one embodiment, the output of the error amplifier is electrically coupled to the gain control input through a transistor. According to another embodiment, the transistor is powered by a battery voltage, and the reference signal is the battery voltage minus a voltage drop larger than a limit voltage of the transistor. According to still another embodiment, the power amplifier is not saturated when the gain control signal is less than the reference signal. According to still another embodiment, the power detector signal is proportional to the logarithm of an RF voltage at the output of the power amplifier. According to still another embodiment, the power detector signal is proportional to an RF voltage at the output of the power amplifier.

According to another embodiment a power amplification circuit further comprises a linear amplifier to receive the detector signal and to provide an amplified detector signal to the second error amplifier input. According to still another embodiment, the linear amplifier has unity gain. According to still another embodiment, the linear amplifier has non-unity gain.

According to still another embodiment, the saturation detector is a comparator.

According to another embodiment, a power amplification circuit further comprises an offset generator circuit to receive the saturation detection signal from the saturation detector and to provide, in response to the saturation detection signal indicating that the gain control signal exceeds the reference signal, an offset signal to the first input of the error amplifier. According to still another embodiment the offset generator circuit comprises a current source; a switch to activate the current source in response to the saturation detection signal indicating that the gain control signal exceeds the reference signal; and a linear amplifier having an input coupled to the current source and an output providing an offset signal, the output electrically coupled to the first input of the error amplifier. According to still another embodiment the output of the linear amplifier is electrically coupled to the first input of the error amplifier through a transistor. According to still another embodiment, the offset generator circuit generates a ramping offset signal in response to the saturation detection signal indicating that the gain control signal exceeds the reference signal.

According to another embodiment, a power amplification circuit further comprises an offset cutoff circuit to freeze the ramping offset signal in response to a signal based upon the offset signal exceeding an offset cutoff threshold signal. According to still another embodiment, the offset cutoff threshold signal is a signal based upon the power detector signal minus a predetermined voltage. According to still another embodiment, the offset cutoff circuit comprises: a cutoff comparator having a first input to receive a signal based upon the offset signal; a second input to receive the offset cutoff threshold signal; and an output indicating whether the signal at the first input exceeds the offset cutoff threshold signal, the output being electrically coupled to the offset generator circuit; wherein the offset generator circuit is deactivated in response to the comparator output indicating whether the signal at the first input exceeds the offset cutoff threshold signal.

According to another embodiment, a power amplification circuit further comprises a capacitor electrically coupled between the current source and ground.

According to another aspect of the present invention, a method of amplifying a first signal is presented, the method comprising acts of: receiving a gain setpoint signal; generating a gain control signal based upon the gain setpoint signal; amplifying the first signal based upon the gain control signal; detecting whether the gain control signal exceeds a predetermined threshold; and providing a saturation detection signal indicative of whether the gain control signal exceeds the predetermined threshold. According to one embodiment, the act of generating the control signal further comprises: receiving a power detector signal indicative of the amplified first signal; and generating a gain control signal based upon the power detector signal and the gain setpoint signal.

According to another embodiment, the method further comprises generating a correction signal in response to the saturation detection signal indicating that the gain control signal exceeds the predetermined threshold; and applying the correction signal to the gain setpoint signal. According to still another embodiment, the method further comprises detecting whether the correction signal exceeds a predetermined cutoff threshold; and generating a correction cutoff signal in response to the correction signal exceeding a cutoff threshold. According to still another embodiment, the method comprises ceasing an increase of the correction signal in response to the correction cutoff signal. According to still another embodiment, the method comprises maintaining the correction signal at a constant value in response to the correction cutoff signal.

According to another aspect of the present invention, a power amplification circuit is disclosed, the circuit comprising a power amplifier to receive an input signal and generate an amplified output signal; a power detector to provide a power detector signal indicative of the output signal of the power amplifier; a control circuit to receive a setpoint signal and producing a gain control signal that controls a gain of the power amplifier according to the setpoint signal; and means for providing a saturation detection signal indicating whether the gain control signal is within a saturation detection threshold of a reference signal. According to one embodiment, the power amplification circuit further comprises correction means for generating and applying a correction signal to the setpoint signal in response to the saturation detection signal indicating that the gain control signal is within a saturation detection threshold of a reference signal. According to another embodiment, a power amplification circuit further comprises monitor means for generating a correction cutoff signal if the correction signal exceeds a cutoff threshold. According to still another embodiment, a power amplification circuit further comprises cutoff means for ceasing an increase of the correction signal in response to the correction cutoff signal. According to still another embodiment, a power amplification circuit further comprises sustaining means for maintaining the correction signal in response to the correction cutoff signal.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
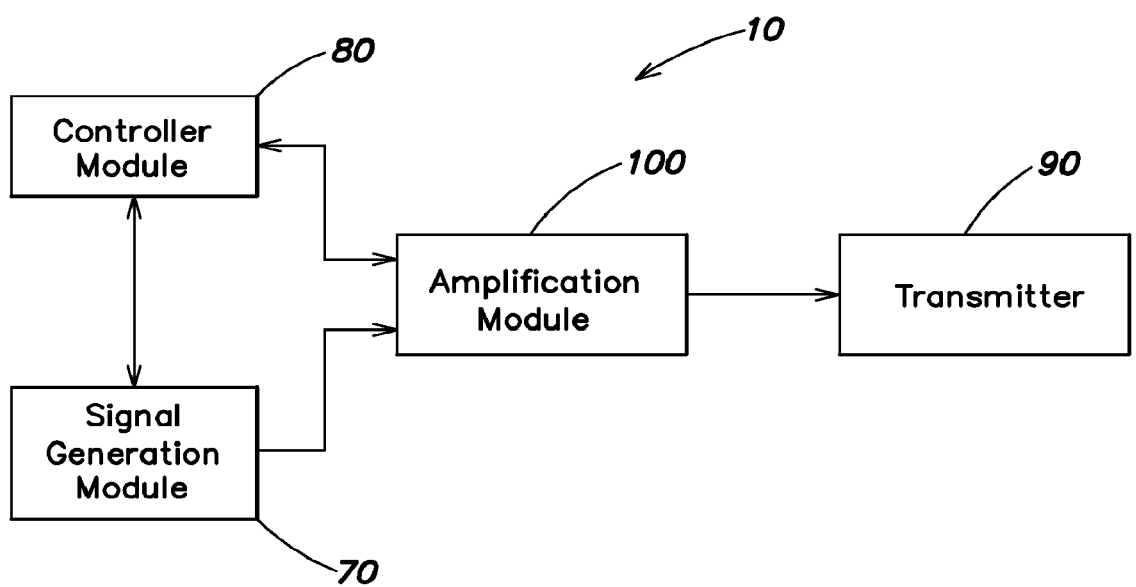
FIG. 1 is a block diagram of an exemplary transmission system having an amplification module.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The methods and systems described herein may be used in a transmission application where there is an amplification stage whose gain is controlled by a control loop. A diagram of one exemplary embodiment of such a system is illustrated in FIG. 1. The system 10 of FIG. 1 may be, for example, a transmission module of a cellular telephone, personal digital assistant, etc. The exemplary system 10 includes a signal generation module 70 that includes signal generation circuitry and a controller module 80 that includes control circuitry. The signal generation module 70 and the controller module 80 may be implemented in one or more digital processors, and/or incorporate some analog circuitry. Amplification module 100 receives and amplifies the signals generated in the signal generation module, and delivers them to a transmitter 90 (such as an antenna) for transmission. Controller module 80 provides a gain control signal to amplification module 100. Amplification module 100 includes a gain control loop that uses the control signal to determine the gain by which the signal is amplified for transmission.

Figure 2:
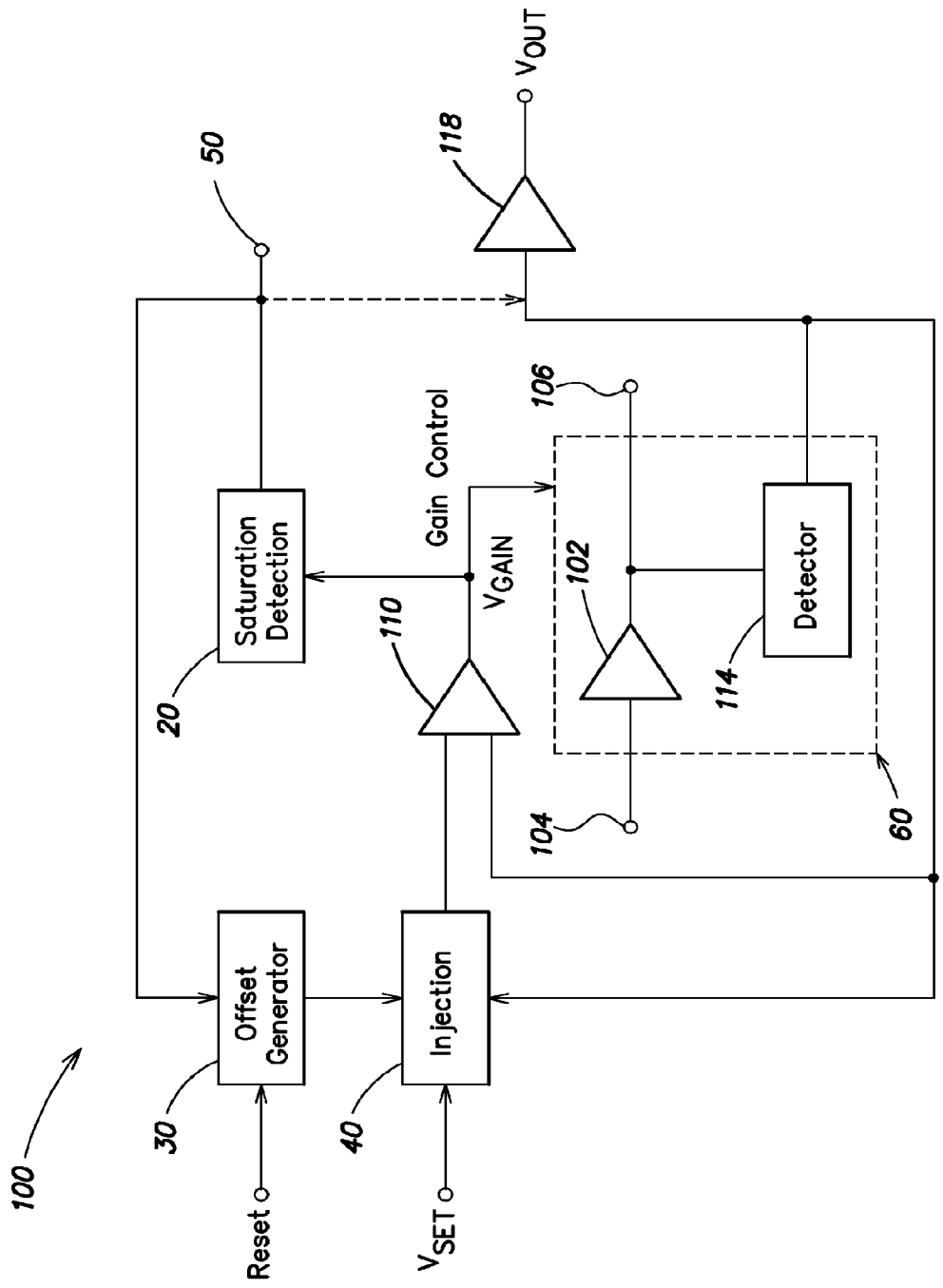
FIG. 2 is a block diagram of an exemplary embodiment of a circuit for detecting and correcting saturation in a power control loop.

As noted above, saturation of the amplification control loop can degrade performance of the control loop, leading to amplifier output that is not optimized FIG. 2 illustrates, in block diagram form, an exemplary amplification module 100 having circuitry to detect saturation (or the imminent onset of saturation) and, optionally, to apply a correction signal to correct saturation.

The amplification module 100 includes a power amplification circuit 60, which includes power amplifier 102 having an input terminal 104 and an output terminal 106. The power amplification circuit 60 also includes a RF detector 114 (which may be logarithmic or linear in its response) that samples the output of the power amplifier and provides feedback to an error amplifier 110 (optionally through a buffer or other amplifier, not shown). The output of RF detector 114 may also be provided (optionally through a buffer 118) to an output $V_{OUT}$, which may be monitored, for example, by another module of the device 10 in which the amplification module 100 is deployed, such as the controller module 80.

The error amplifier 110 also receives (either directly or indirectly via an injection circuit 40 discussed further below) as an input a loop control signal $V_{SET}$ which provides a setpoint for the gain of the power amplifier 102. In one exemplary embodiment, loop control signal $V_{SET}$ provides a time-varying profile such as a sine wave or other ramping profile that the gain of the power amplifier, and therefore the power profile of the amplifier output, will follow. The output of the error amplifier 110 is a gain control signal $V_{GAIN}$, provided to the power amplification circuit 60 to control the gain of the power amplifier 102. Thus, in normal loop operation, error amplifier 110 outputs $V_{GAIN}$ such that the (optionally amplified) output of detector 114 is equal to the input control signal $V_{SET}$. Error amplifier 110 may be configured as a proportional amplifier, integral amplifier, derivative amplifier, or any suitable combination of those elements in accordance with loop design requirements. As discussed further below in connection with FIG. 3, error amplifier 110 may also include a high-current output stage, either integrated into the error amplifier, or as a discrete output stage.

The gain control signal $V_{GAIN}$ is also sent to a saturation detection circuit 20 that determines if saturation exists or is imminent. In one exemplary embodiment (discussed further below in connection with FIG. 3) saturation detection circuit 20 compares $V_{GAIN}$ with a threshold or reference voltage that is below the $V_{GAIN}$ value at which loop performance is noticeably degraded due to saturation, and if $V_{GAIN}$ exceeds that threshold or reference voltage, returns a signal affirmatively indicating saturation. In this way, the saturation detection circuit 20 can provide an unambiguous result (used to indicate, and in some embodiments to initiate correction of, saturation) when saturation is approaching, but before either the loop performance or the power amplifier performance has begun to degrade appreciably.

The saturation detection circuit, in one embodiment, provides a saturation indication signal 50 that indicates whether saturation exists. The saturation indication signal 50 may be, for example, a binary signal that is high when saturation exists and low when it does not. The saturation indication signal 50 may alternatively be any detectable offset voltage that distinguishes saturation from non-saturation, added to (or even subtracted from) $V_{OUT}$ of the detector 118. The saturation indication signal 50 may be received by the controller module 80, for example, and the controller module 80 may respond in some appropriate way. In some embodiments the controller module 80 responds, for example, by reducing $V_{SET}$ until the loop saturation is corrected.

In another embodiment, the amplification module 100 includes an offset generator circuit 30 which receives the saturation indication signal 50 provided by the saturation detection circuit 20. The offset generator circuit 30 generates an offset voltage that is summed with $V_{SET}$ by offset injection circuitry 40, to reduce the gain of the power amplifier. In one exemplary embodiment, the offset voltage generated by offset generator circuit 30 ramps to a value sufficient to bring the power amplifier control loop out of saturation. The offset generator circuit 30 may, in some embodiments, include circuitry that stops the ramping of the offset voltage when the reduction in gain of amplifier 102 is sufficient to bring the control loop out of saturation. In one exemplary embodiment, the offset generator circuit 30 includes circuitry, such as a capacitance, to hold the offset voltage after the ramp of the offset voltage is stopped. In embodiments in which the amplification module 100 is used in the transmission module of a device, such as a cellular telephone or a PDA, the offset generator circuit 30 may hold the offset voltage for the duration of the transmission burst. A reset signal may be used to clear the offset voltage prior to the commencement of the next burst. For example, in one embodiment, the reset is achieved by closing a switch in offset generation circuitry 30 that shorts to ground a capacitor holding the offset voltage.

Figure 3:
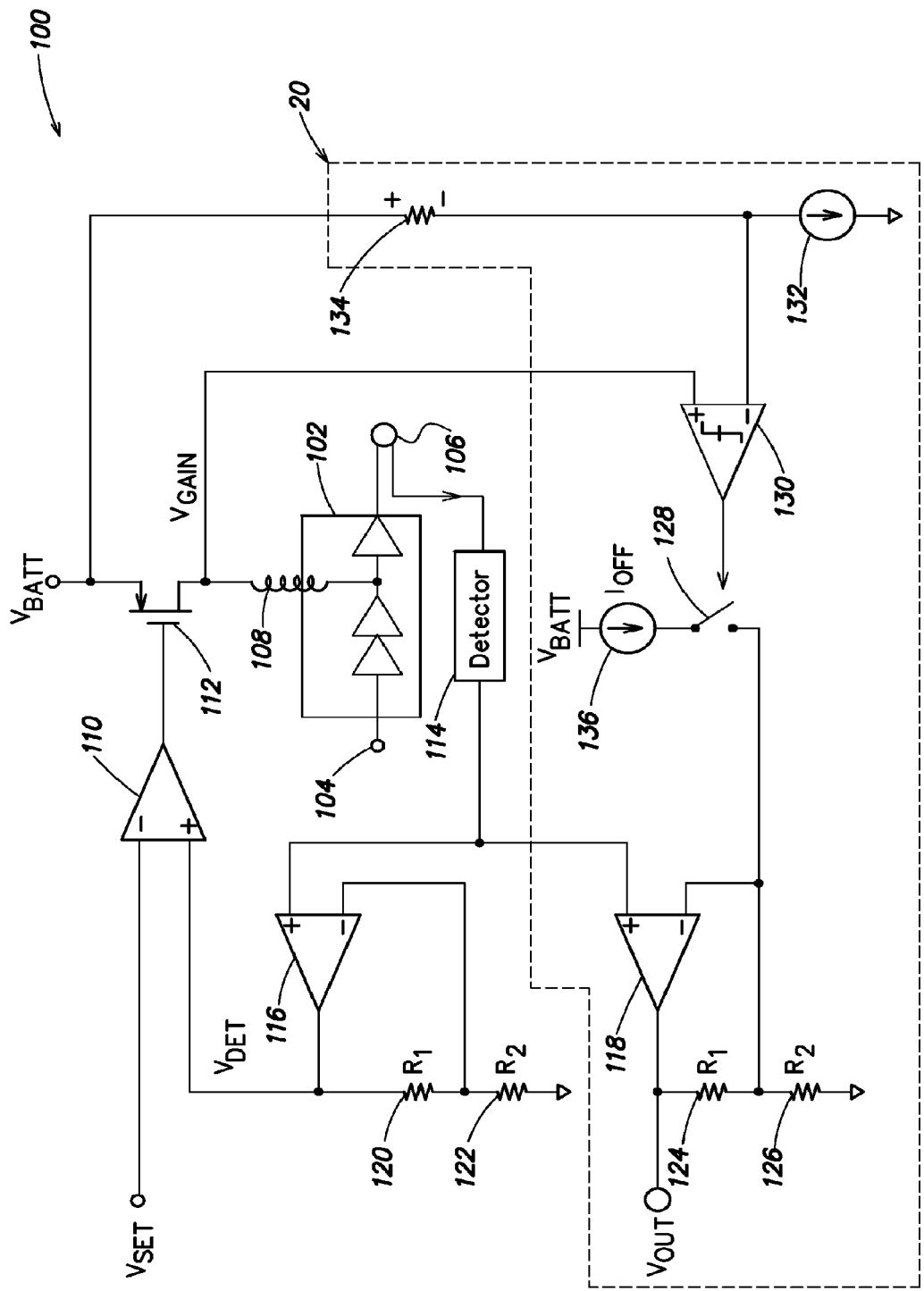
FIG. 3 is an exemplary embodiment of a power amplification circuit having loop saturation detection circuitry.
Figure 4:
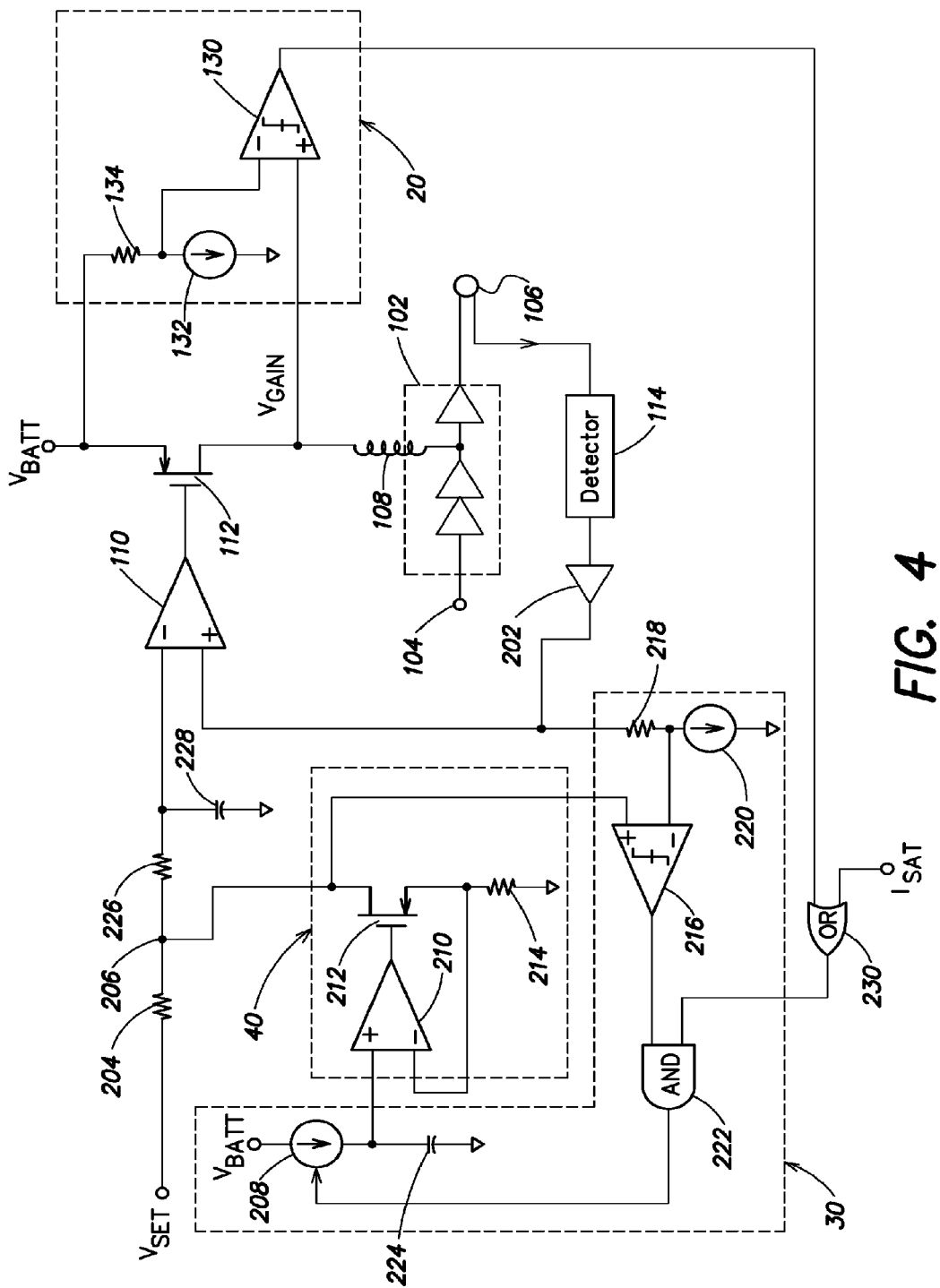
FIG. 4 is an exemplary embodiment of a power amplification circuit having circuitry for detecting and correcting saturation in the power amplification control loop.

FIGS. 3 and 4 illustrate in more detail certain exemplary embodiments of the system depicted in the block diagram of FIG. 2.

FIG. 3 illustrates one exemplary embodiment of an amplification module 100 having a capability to detect saturation and to provide a detection signal that may be used to alert another device or component, for example controller module 80, to the presence or imminence of loop saturation. As discussed further below, the detection circuit may be designed to provide an unambiguous indication of saturation (for example, a positive saturation indication signal) with whatever tolerance is desired; in some applications the detection circuit may respond when the loop is near saturation but not yet in saturation, while in others, the detection circuit may respond when actual saturation occurs. Throughout this disclosure, the term "saturation" is generally used to refer to any saturation or near-saturation condition to which an embodiment of the saturation detection circuit is designed to respond. In some embodiments, therefore, "saturation" may refer to a gain control signal exceeding a certain threshold above which saturation is expected to occur.

In the embodiment illustrated in FIG. 3, the amplification module 100 includes a power amplifier 102, which may include a plurality of cascaded gain stages. In the illustrated embodiment, for example, power amplifier 102 includes three cascaded gain stages, although other types of power amplifiers (for example, with more or fewer cascaded gain stages) may be used. The power amplifier 102 receives at input terminal 104 a signal to be amplified (such as a transmission burst) and produces at output terminal 106 an amplified output signal. The signal at input terminal 104 may be received, for example, from the signal generation module 70 of FIG. 1, and the signal at output terminal 106 may be provided, for example, to the transmitter 90.

Returning to FIG. 3, the gain of power amplifier 102 is driven by $V_{GAIN}$, which, in one exemplary embodiment, is coupled to power amplifier 102 through an inductor 108 to filter any ac components that may be present in the dc signal $V_{GAIN}$. $V_{GAIN}$ is determined by the feedback network on the error amplifier 110. The error amplifier 110 operates to keep $V_{DET}$ equal to the input signal $V_{SET}$, which is the external control signal controlling the overall gain of amplification module 100. In the embodiment illustrated in FIG. 3, $V_{GAIN}$ is sourced by a FET 112 which is driven by the error amplifier 110. An advantage of using FET 112 is that many operational amplifiers (such as high-precision operational amplifiers that might be desirable to use for error amplifier 110 in a control loop where precision control is desired) cannot source sufficient current to drive the power amplifier 102. In one exemplary embodiment power amplifier 102 draws as much as 200 mA from the $V_{GAIN}$ drive. In the illustrated embodiment, FET 112 is a PFET, but it should be recognized that FET 112 can be replaced by other types of transistors such as an NFET or pnp bipolar transistors, or any like component that can provide the necessary current to drive power amplifier 102. Additionally, FET 112 need not be a discrete component at all, but can be the output stage of an error amplifier 110 which is capable of sourcing the required current. In the embodiment of FIG. 3, in which FET 112 is a discrete component, in order to ensure that $V_{GAIN}$ increases with an increase in $V_{SET}$, $V_{SET}$ is applied to the inverting input of error amplifier 110 and the feedback signal (discussed further below) is applied to the non-inverting input of error amplifier 110. It should be understood that where FET 112 is the output stage of the error amplifier 110, rather than a discrete component, the inputs to the error amplifier 110 may be reversed to achieve a stable control loop.

As noted above, error amplifier 110 operates to keep $V_{DET}$ equal to the input signal $V_{SET}$. $V_{DET}$ is a buffered and/or amplified version of the output signal from a RF detector 114 that samples the amplified signal at the output terminal 106 of the power amplifier 102 and provides a signal indicative of the magnitude of the signal at the output terminal 106 of the power amplifier 102. In one exemplary embodiment RF detector 114 is a logarithmic (log) power detector, meaning that it outputs a voltage that is proportional to the log of the RF voltage at its input. Alternatively, RF detector 114 may, in certain embodiments, be a linear detector, producing an output voltage proportional to the RF voltage at its input.

In one exemplary embodiment, the output signal from RF detector 114 is provided to a pair of linear amplifiers 116 and 118 whose output signals are $V_{DET}$ and $V_{OUT}$ respectively. $V_{DET}$ provides the feedback for the power control loop. In certain embodiments, $V_{OUT}$ is used as the saturation indicator signal; $V_{OUT}$ and switch 128 are discussed further below. In one exemplary embodiment, amplifiers 116 and 118 are very closely matched, e.g., by appropriate selection of the amplifiers themselves and resistors 120, 122, 124, and 126, so that $V_{OUT}$ is equal to $V_{DET}$ as long as switch 128 is open. In one exemplary embodiment, resistors 120 and 122 are chosen to give amplifier 116 a suitable gain for closed-loop control of the power amplifier 102 via error amplifier 110, FET 112, and $V_{GAIN}$. Generally speaking linear amplifier 116 may have unity gain, non-unity gain, or a derivative and/or integral component to its gain (achieved, for example, by adding one or more capacitors in parallel or in series with resistor 120). The optimal value for the gain of amplifier 116 will depend upon the sensitivity of RF detector 114, and other loop parameters. (As discussed further below, the use of $V_{OUT}$ amplifier 118 is optional; it may be used in embodiments where it is convenient to have a saturation detection signal $V_{OUT}$ that is based upon the feedback signal $V_{DET}$; in certain embodiments the $V_{OUT}$ amplifier 118 is absent.) Additional components (not illustrated) may also be used in accordance with loop design principles in order to achieve desired loop performance. For example, the feedback network of error amplifier 110 may include a capacitor to achieve integration in the feedback loop.

In one exemplary embodiment, the saturation detection portion of the circuit illustrated in FIG. 3 (corresponding to saturation detection circuit 20 in FIG. 2) includes the comparator 130, the current source 136, the switch 128, the amplifier 118, and the resistors 124 and 126. In the embodiment shown, the comparator 130 is a Schmitt trigger; in other embodiments comparator 130 may be any suitable comparator. Comparator 130 compares $V_{GAIN}$ to a voltage drop determined by current source 132, resistor 134, and battery voltage $V_{BATT}$. The voltage drop may be selected based upon the parameters of FET 112 as follows.

In normal (non saturated) operation, $V_{GAIN}$ changes with $V_{SET}$, adjusting the gain of the power amplifier 102 such that $V_{DET}=V_{SET}$. If $V_{GAIN}$ gets too close to $V_{BATT}$, however, FET 112 (which, in one exemplary embodiment, is a PFET) enters an ohmic region, causing $V_{GAIN}$—and hence the loop gain—to drop significantly. The saturation detector permits detection of the approach of this condition before $V_{GAIN}$ gets close enough to $V_{BATT}$ to cause the gain to drop.

The voltage at which the FET 112—and hence the control loop—ceases to function is a property of the FET 112. Thus, in one exemplary embodiment, the value of resistor 134 and/or of the current sourced by current source 132 are chosen such that the voltage drop across resistor 134 is equal to or slightly greater than the FET limit voltage. Thus, the output of the comparator 130 will change when $V_{GAIN}$ exceeds $V_{BATT}$ minus the voltage drop across resistor 134—that is, when $V_{GAIN}$ comes within the FET limit of $V_{BATT}$. (As noted previously, component 112 need not be a FET; it will be readily appreciated that the comparator activation condition may be selected analogously for whatever type of transistor is used to source $V_{GAIN}$. Additionally, while in the illustrated circuit the comparator 130 is configured such that its output goes positive when $V_{GAIN}$ comes within the FET limit of $V_{BATT}$, it should be appreciated that the comparator can be configured with the opposite polarity, provided its output distinguishes whether or not $V_{GAIN}$ exceeds the reference at the comparator's other input terminal.) In applications where loop saturation is particularly deleterious or where avoidance of saturation is particularly desirable for whatever reason, the resistor 134 and/or current source 132 may be selected so that the comparator is triggered well before $V_{GAIN}$ is high enough for the loop to actually reach saturation. In such a circuit some amount of peak power output is traded for the security of an assured avoidance of loop saturation. In other applications—for example, where the ramp profile defined by time variance of $V_{SET}$ is less critical, or in applications in which it is desirable to maximize the power output of the power amplifier 102 and the risk of a closer approach to saturation is acceptable—the resistor 134 and/or current source 132 may be selected to allow $V_{GAIN}$ to come closer to $V_{BATT}$ before triggering the comparator 130. In this way sensitivity may be set to detect either an impending saturation or an actual saturation.

In the illustrated embodiment, $V_{BATT}$ is the DC voltage supplied by the battery of the device (such as a cell phone, personal digital assistant, etc.) in which amplification module 100 is deployed. It should be appreciated that $V_{BATT}$ may vary from device to device or even within a single device depending upon what battery is used, its state of charge, etc. In an alternative embodiment, comparator 130 compares $V_{GAIN}$ to a separate reference voltage $V_{REF}$ (not illustrated) rather than to a reference voltage based upon $V_{BATT}$ as in the embodiment illustrated in FIG. 3. In such an embodiment $V_{REF}$ can be used as the input signal to comparator 130 instead of $V_{BATT}$ minus the voltage drop across resistor 134. The voltage reference $V_{REF}$ in such an embodiment is then selected such that, at the lowest $V_{BATT}$ at which the circuit might operate, $V_{BATT}$-$V_{REF}$ is large enough to keep FET 112 in the desired operating region; that is, FET 112 does not enter the ohmic region as long as $V_{GAIN}$ is less than $V_{REF}$. In such an embodiment, comparator 130 will be triggered when $V_{GAIN}$ exceeds $V_{REF}$, even if the circuit is deployed with a higher $V_{BATT}$. Such an embodiment may be desirable where the circuit as a whole is designed to operate effectively at some minimum value of $V_{BATT}$; in such embodiments there may be little advantage in allowing $V_{GAIN}$ to go higher even if a higher $V_{BATT}$ is used. The voltage reference $V_{REF}$ may be provided externally to the amplifier module 100; by a voltage regulator on the same board as the amplifier module 100; by a current source applied across a resistor; or by any other suitable means of providing a constant reference voltage.

Regardless of which approach to generating a reference voltage is used, when saturation occurs or is imminent—when $V_{GAIN}$ approaches $V_{BATT}$ to less than the voltage drop across resistor 134 or when $V_{GAIN}$ exceeds whatever reference voltage $V_{REF}$ is used as the comparator input signal—the output signal from comparator 130 changes, closing switch 128. When switch 128 is closed, current $I_{OFF}$ flows from current source 136, causing a negative offset in the saturation detector output voltage $V_{OUT}$. Thus, while (as discussed above) $V_{OUT}$=$V_{DET}$ in normal non-saturated operation, when saturation occurs switch 136 closes and a step change occurs in $V_{OUT}$. The current $I_{OFF}$ from current source 136 may be selected so that the change in $V_{OUT}$ is readily detected.

In alternative embodiments, the output signal from comparator 130 is itself used as the saturation detection signal, without the need for current source 136, switch 128, or $V_{OUT}$ amplifier 118. As noted previously, there may be applications in which it is desirable or convenient to have a saturation detection signal $V_{OUT}$ that is based upon the feedback signal $V_{DET}$; and the illustrated configuration of current source 136, switch 128, and $V_{OUT}$ amplifier 118 is one way to achieve that. However, the comparator 130 output signal can itself provide a digital indication of saturation.

Whether the output signal from comparator 130 is used directly or converted into a step offset on the detector signal, the detection circuit shown in FIG. 3 converts the onset of saturation into an easy-to-detect step either in $V_{OUT}$ or in the output signal from comparator 130, despite the fact that the onset of saturation may be difficult to detect directly in $V_{GAIN}$ or in the signal at the output terminal 106 of the power amplifier 102. Referring back to FIG. 1, the step in $V_{OUT}$ or in the output signal from comparator 130 may be detected by the controller module 80 that responds, for example, by lowering $V_{SET}$ until saturation ends.

The embodiment illustrated in FIG. 4 includes circuitry to both detect the saturation, and to respond to saturation and correct it. Like the circuit in FIG. 3, the embodiment illustrated in FIG. 4 includes a power amplifier 102 whose gain is controlled by the output of a FET stage 112, coupled through inductor 108. A RF detector 114 samples the signal at the output terminal 106 of the power amplifier 102, and the output signal from the RF detector serves as the feedback signal to the error amplifier 110. The gain of the control feedback loop may be set as appropriate by amplifier 202 (analogous to amplifier 116 in FIG. 3).

As with the saturation detection circuit of FIG. 3, the embodiment illustrated in FIG. 4 includes a comparator 130, the output of which indicates when $V_{GAIN}$ comes within the FET limit of $V_{BATT}$, signaling saturation. The output signal from comparator 130 indicates the presence of saturation and may be used to correct saturation as follows.

Under normal, non-saturated operation, a negligible amount of current flows through resistor 204, and the voltage at node 206 is substantially the same as the gain setpoint $V_{SET}$. In saturation, however, it is advantageous to modify the gain setpoint so that $V_{GAIN}$, which controls the gain of power amplifier 102, will also be reduced, pulling the amplifier 102 out of saturation. The circuit illustrated in FIG. 4 is one way to achieve that objective, with circuits corresponding to the offset generator circuit 30 and the injection circuit 40 of FIG. 2.

In the embodiment illustrated in FIG. 4, in response to the output signal from the comparator 130 indicating saturation, current source 208 is switched on. Because of capacitor 224, this causes the voltage at the non-inverting input terminal of the amplifier 210 to increase, which turns on the transistor 212 and draws current through resistors 204 and 214, pulling down the voltage at node 206. Thus, using the output signal from the comparator 130 to control the current source 208 reduces the input signal to the error amplifier 110 when saturation is indicated. The result is that the circuit automatically applies a correction to the setpoint of the control loop, and hence automatically reduces the gain of the power amplifier 102, pulling the amplifier 102 back out of saturation.

Figure 5:
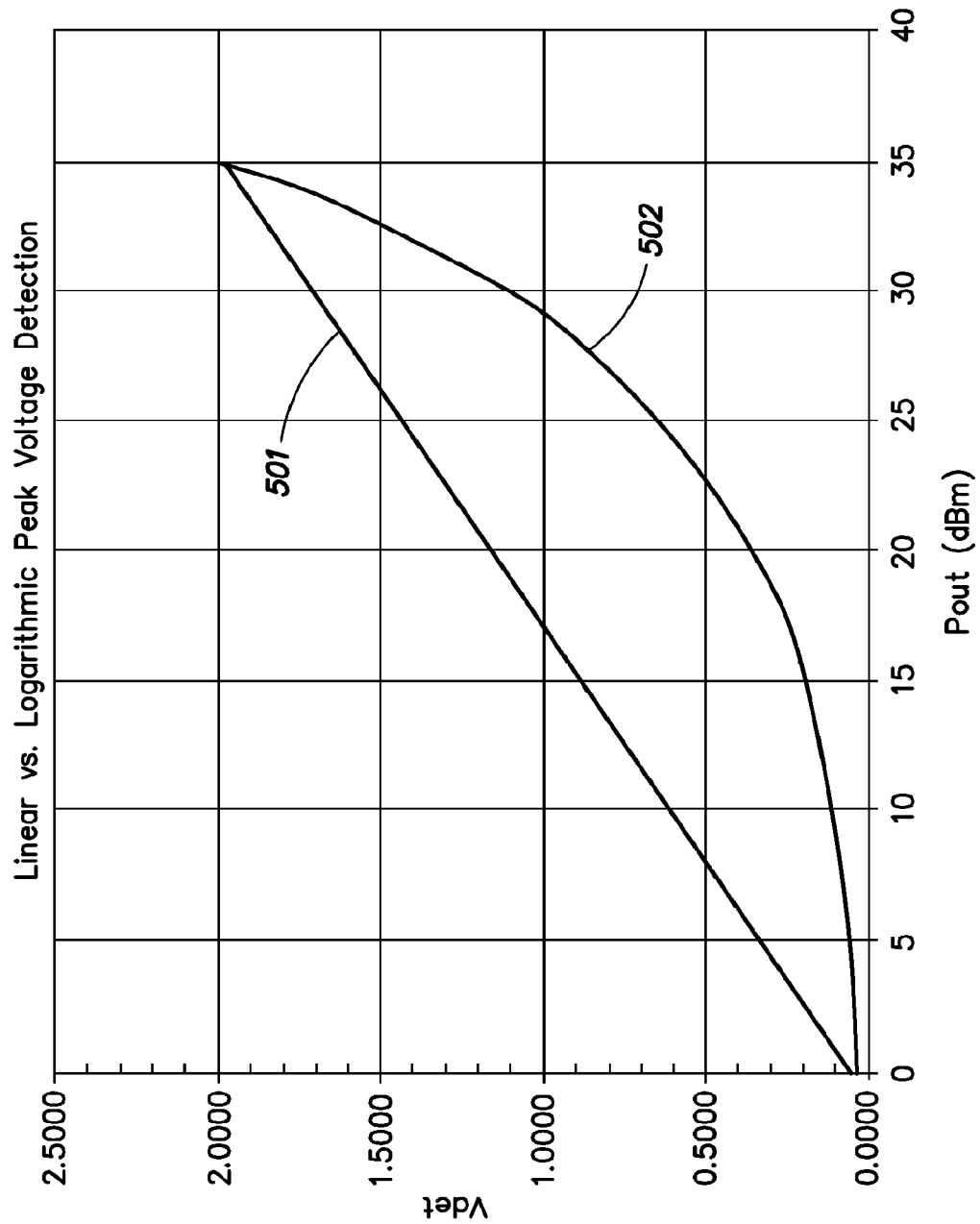
FIG. 5 is a graph showing the response curve of an exemplary logarithmic RF detector and an exemplary linear RF detector.

An advantage of using logarithmic (as opposed to linear) detection which is realized in the embodiment of the correction circuit illustrated in FIG. 4 is now described. When logarithmic detection is used, the control signal $V_{SET}$ may be reduced without affecting its overall profile (which, in one exemplary embodiment in which the amplifier module 100 is used in the transmission stage of a cellular telephone, is sinusoidal). Preserving the shape of the $V_{SET}$ profile may be important, for example, for compliance with cellular telephone specifications such as adjacent channel spectral emission and time mask boundaries. An exemplary curve of RF detector response versus the power output of amplifier 102 is shown in FIG. 5 for both logarithmic (curve 501) and linear (curve 502) detectors. Because the power output of the amplifier 102 varies according to the square of the RF voltage, the response curve 502 of a linear detector (which produces a detector signal proportional to the RF voltage) is exponential. On the other hand, the response curve 501 of the logarithmic detector (which produces a detector signal proportional to the log of the RF voltage) is linear.

Because the detector is in the control loop that controls the amplifier gain according to $V_{SET}$, where a linear detector is used, attempting to apply a fixed offset correction would distort the response of the loop to a time-varying (i.e. sinusoidal) $V_{SET}$ profile. Because of the exponential response curve of the linear detector, the slope of the response differs at the high end and low ends of the power range. For a detector with the exemplary sensitivity illustrated in FIG. 5, at power levels near saturation (near the top of an exemplary sinusoidal $V_{SET}$ profile), a nearly 100 mV correction to $V_{SET}$ is required to achieve a 0.5 dB power reduction. If that 100 mV correction is applied as a constant correction, however, at low output power (near the bottom of an exemplary sinusoidal $V_{SET}$ profile), the 100 mV correction to $V_{SET}$ would result in over 10 dB reduction of the output power. Thus, a simple dc offset correction to $V_{SET}$ could result in unacceptable distortion of the profile of the amplified signal. It should be appreciated that linear detection could be used, provided the correction signal applied at node 206 were multiplied to compensate for the nonlinearity in the $V_{DET}$ signal as a function of the power output of amplifier 102, instead of simply added to $V_{SET}$ as an offset. In contrast, the simple additive properties of the control loop with logarithmic detection permit applying a correction to the loop control input signal without distortion of the control signal profile.

Returning to FIG. 4, it is desirable for the circuit to stop modifying the gain setpoint provided to the error amplifier 110 when the loop is no longer saturated, so that the gain of the power amplifier 102 is not reduced more than is necessary to correct saturation. The embodiment illustrated in FIG. 4 achieves this objective as well with comparator 216, which compares the voltage at node 206 with $V_{DET}$. (Since $V_{DET}$ is the buffered and/or amplified output of RF detector 114, $V_{DET}$ is directly representative of the output of the power amplifier. During amplifier saturation, $V_{DET}$ is a direct indication of the saturated power of the amplifier 102.) The voltage at the negative input terminal of the comparator 216 is determined by current source 220 and resistor 218. The output signal from the comparator 216 is high when the voltage at node 206 is greater than $V_{DET}$ minus the voltage drop across resistor 218. Thus, the voltage drop across resistor 218 limits how far the voltage at node 206 will be reduced relative to $V_{DET}$ at saturation. Because of AND gate 222, the correction to $V_{SET}$ will only occur when comparator 130 indicates saturation and comparator 216 indicates that the corrected $V_{SET}$ voltage (at node 206) exceeds $V_{DET}$ minus the threshold set by resistor 218 and current source 220.

The appropriate threshold depends upon the properties of the circuit, such as the sensitivity of the RF detector 114 and the desired safety margin for maximizing the gain of power amplifier 102 while keeping it out of a saturated regime. In one exemplary embodiment, a 0.5 dB reduction below the saturation power of the amplifier 102 is generally sufficient to take the amplifier 102 out of saturation. In an embodiment having a typical detector sensitivity of 40 mV/dB, reducing $V_{SET}$ by 20 mV upon detection of saturation would be satisfactory. In such an embodiment current source 220 and resistor 218 may be chosen such that the voltage drop across resistor 218, and hence the threshold at which the ramping of the correction ceases, is 20 mV.

The use of this threshold and comparator 216 to prevent the corrected $V_{SET}$ voltage (at node 206) from dropping too far below what is needed to correct saturation is advantageous because checking the corrected $V_{SET}$ directly can be faster than waiting for comparator 130 to register the end of the saturation. In particular, in the embodiment illustrated in FIG. 4, the $V_{SET}$ input to the control loop is filtered by resistor 226 and capacitor 228 (in one exemplary embodiment, 1/RC~300 kHz), to remove undesirable higher-frequency noise from the $V_{SET}$ input (such as noise from a digital-to-analog converter (DAC) providing $V_{SET}$ to the loop circuit). Because of this filter, detection of saturation on the signal at the output terminal 106 of the power amplifier 102 is considerably slower than using the corrected $V_{SET}$ instead. In alternative embodiments, this filter may not be required; in such embodiments the saturation correction may be added to $V_{SET}$ using any other way of summing voltage signals.

Even when the output signal from comparator 216 reflects that the voltage at node 206 has dropped enough to correct saturation, and shuts off current source 208, capacitor 224 will hold the voltage to which it was charged while current source 208 was on. Thus, FET 212 will continue to draw current, keeping the voltage at node 206 at the reduced level relative to $V_{SET}$ that maintains the gain of power amplifier 102 at just below saturation. How long capacitor 224 can hold that state depends upon its capacitance; in one exemplary embodiment, in which the power amplification module 200 is used in the transmission stage of a wireless device, capacitor 224 may be chosen to hold most of its charge for the duration of a transmission burst.

Thus, comparing the exemplary embodiment illustrated in FIG. 2 with the specific exemplary embodiment illustrated in FIG. 4, an exemplary offset generator circuit 30 comprises the current source 208 and the capacitor 224 that commence the ramping of a correction voltage in response to a positive signal from AND gate 222. AND gate 222 in turn responds to a positive signal from comparator 216, turning off the ramping of the correction voltage when the correction voltage reaches the desired maximum correction. Likewise, an exemplary injection circuit 40 comprises the operational amplifier 210, transistor 212, and resistor 214 that operate together to inject the offset into the control loop by altering the voltage at node 206.

In the embodiment illustrated in FIG. 4, OR gate 230 provides an optional additional way of triggering the current source 208 and applying a correction to the control signal $V_{SET}$. In addition to the circuits shown in FIG. 3 and/or FIG. 4 that monitor a voltage saturation of the control loop, there may be other circuitry (not shown) that monitors the power amplifier 102 for the existence of saturation. An OR gate 230 supplied with an input $I_{SAT}$ allows a current limit monitor to alternatively trigger the saturation correction circuitry even when the saturation detection circuitry based upon $V_{GAIN}$ does not indicate saturation. $I_{SAT}$ may be, for example, a logical signal output by a current limit monitor to indicate saturation of a current flow somewhere in the loop. The use of one or more OR gates 230 can allow triggering of the saturation correction circuit upon any condition desired, even in the absence of voltage saturation.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:
1. A power amplification circuit comprising:
   a power amplifier having a first input to receive an input signal, a second input to receive a gain control signal, and an output to provide an amplified output signal based upon the input signal and the gain control signal;
   an RF detector having an input coupled to the output of the power amplifier and an output to provide a detection signal indicative of a logarithm of a power of the amplified output signal;
   an error amplifier having a first input to receive an amplification control signal, a second input to receive a signal that is based on the detection signal and an output electrically coupled to the second input of the power amplifier;
   a saturation detector having a first input to receive the gain control signal, a second input to receive a reference signal and an output to provide a saturation detection signal in response to the gain control signal differing in voltage from the reference signal by less than a first predetermined voltage; and an offset circuit having a first input to receive the saturation detection signal, a second input electrically coupled to the second input of the error amplifier and an output electrically coupled to the first input of the error amplifier, the offset circuit being configured to decrease a voltage level of the amplification control signal by up to a second predetermined voltage in response to the saturation detection signal and the amplification control signal differing in voltage from the signal that is based on the detection signal by less than the second predetermined voltage.

2. The power amplification circuit of claim 1 wherein the output of the error amplifier is electrically coupled to the second input of the power amplifier through a transistor, the output of the saturation detector providing the saturation detection signal in response to the gain control signal differing in voltage from the reference signal by less than a threshold voltage of the transistor.

3. The power amplification circuit of claim 2 wherein the output of the RF detector is electrically coupled to the second input of the error amplifier and the second input of the offset circuit through a linear amplifier.

4. The power amplification circuit of claim 3 wherein the linear amplifier has unity gain.

5. The power amplification circuit of claim 4 wherein the offset circuit includes:
an offset generator having a first input to receive the saturation detection signal, a second input to receive the signal that is based on the detection signal, a third input to receive the amplification control signal and an output to provide an offset control signal in response to the saturation detection signal and the amplification control signal differing in voltage from the signal that is based on the detection signal by less than the second predetermined voltage; and
an injection circuit having an input to receive the offset control signal and an output electrically coupled to the first input of the error amplifier to provide an offset voltage that is summed with the amplification control signal to reduce the voltage level of the amplification control signal by up to the second predetermined voltage in response to the offset control signal.

6. The power amplification circuit of claim 5 wherein the offset generator ceases providing the offset control signal in response to the amplification control signal differing in voltage from the signal that is based on the detection signal by more than the second predetermined voltage.

7. The power amplification circuit of claim 1 wherein the offset circuit includes:
an offset generator having a first input to receive the saturation detection signal, a second input to receive the signal that is based on the detection signal, a third input to receive the amplification control signal and an output to provide an offset control signal in response to the saturation detection signal and the amplification control signal differing in voltage from the signal that is based on the detection signal by less than the second predetermined voltage; and
an injection circuit having an input to receive the offset control signal and an output electrically coupled to the first input of the error amplifier to provide an offset voltage that is summed with the amplification control signal to reduce the voltage level of the amplification control signal by up to the second predetermined voltage.

8. The power amplification circuit of claim 7 wherein the offset generator ceases providing the offset control signal in response to the amplification control signal differing in voltage from the signal that is based on the detection signal by more than the second predetermined voltage.

9. A method of amplifying a first signal using a power amplifier, the method comprising acts of:
receiving a setpoint signal;
generating a current from a power source based upon the setpoint signal;
supplying the current to a power input of the power amplifier;
amplifying, in the power amplifier, the first signal based upon the current;
providing a saturation detection signal responsive to the power source differing in voltage from the power input by less than a predetermined threshold;
receiving a power detection signal indicative of a logarithm of a power of the amplified first signal;
generating a correction signal based on the setpoint signal and the power detection signal in response to the saturation detection signal; and
applying the correction signal to the setpoint signal.

10. The method of claim 9 wherein the act of generating includes:
comparing the setpoint signal to the power detection signal;
determining that the setpoint signal differs from the power detection signal by less than a threshold amount; and
generating the correction signal based on the setpoint signal and the power detection signal in response to the saturation detection signal and the determination that the setpoint signal differs from the power detection signal by less than the threshold amount.

11. The method of claim 10 wherein the act of applying the correction signal includes applying the correction signal to the setpoint signal to reduce the setpoint signal by up to the threshold amount.

12. The method of claim 11 further comprising acts of:
determining that the setpoint signal no longer differs from the power detection signal by less than the threshold amount; and
ceasing generation of the correction signal in response to the determination that the setpoint signal no longer differs from the power detection signal by less than the threshold amount.

13. The method of claim 12 further comprising an act of maintaining the correction signal at a constant value for a determined period of time after the act of ceasing generation of the correction signal.

14. The power amplification circuit of claim 7 wherein the injection circuit includes:
an amplifier having a first input to receive the offset control signal, a second input, and an output; and
a transistor having a gate electrically coupled to the output of the amplifier, a drain electrically coupled to the first input of the error amplifier, and a source electrically coupled to the second input of the amplifier and to a reference voltage terminal through a resistor.

15. The power amplification circuit of claim 14 wherein the offset generator includes a current source electrically coupled in series with a capacitor between a voltage supply terminal and a reference voltage terminal, the current source having a input to receive the saturation detection signal and an output electrically coupled to the capacitor and to the first input of the amplifier of the injection circuit.

16. The power amplification circuit of claim 7 wherein the offset generator includes a current source electrically coupled in series with a capacitor between a voltage supply terminal and a reference voltage terminal, the current source having a input to receive the saturation detection signal and an output electrically coupled to the capacitor and to the input of the injection circuit.

17. The power amplification circuit of claim 16 wherein the power amplification circuit is included in a transmission stage of a wireless device and the capacitor has a capacitance sufficient to maintain the offset control voltage at a voltage level that reduces the voltage level of the amplification control signal by up to the second predetermined voltage for a duration of a transmission burst from the transmission stage.

18. The power amplification circuit of claim 1 wherein the output of the RF detector is electrically coupled to the second input of the error amplifier and the second input of the offset circuit through a linear amplifier.

19. The power amplification circuit of claim 1 wherein the power amplification circuit is included in a transmission module of cellular telephone.

20. The power amplification circuit of claim 1 wherein the power amplification circuit is included in a transmission module of a personal digital assistant.

* * * * *